US006805560B1

(12) United States Patent
Budny et al.

(10) Patent No.: US 6,805,560 B1
(45) Date of Patent: Oct. 19, 2004

(54) APPARATUS INTERCONNECTING CIRCUIT BOARD AND MEZZANINE CARD OR CARDS

(75) Inventors: Jacek Budny, Gdynia (PL); Gerard Wisniewski, Gdansk (PL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/653,639

(22) Filed: Sep. 2, 2003

(51) Int. Cl.[7] .............................................. H01R 12/00
(52) U.S. Cl. ...................................................... 439/65
(58) Field of Search .................... 439/65, 71; 361/788, 361/686

(56) References Cited

U.S. PATENT DOCUMENTS

| | | | | |
|---|---|---|---|---|
| 4,498,717 A | * | 2/1985 | Reimer | 439/61 |
| 5,038,308 A | * | 8/1991 | Le et al. | 361/796 |
| 5,706,179 A | * | 1/1998 | Palatov | 361/788 |
| 5,711,677 A | * | 1/1998 | Mui et al. | 439/64 |
| 6,155,842 A | * | 12/2000 | Baitz | 439/61 |
| 6,533,587 B1 | * | 3/2003 | Potter et al. | 439/65 |
| 6,644,979 B2 | * | 11/2003 | Huang | 439/65 |

* cited by examiner

*Primary Examiner*—Phuong Dinh
(74) *Attorney, Agent, or Firm*—Buckley, Maschoff & Talwalkar LLC

(57) ABSTRACT

An apparatus includes a circuit board and a connector assembly which extends outwardly from the circuit board and is capable of simultaneously being connected to a plurality of mezzanine cards.

2 Claims, 10 Drawing Sheets

APPARATUS INTERCONNECTING CIRCUIT BOARD AND MEZZANINE CARD OR CARDS

BACKGROUND

It is known in a circuit board assembly (sometimes referred to as a "blade") to mount a mezzanine card in parallel fashion on a baseboard and to provide for signal interconnection between at least one electronic device on the baseboard and at least one electronic device on the mezzanine card. There is need for increased flexibility in providing interconnection between a baseboard and one or more mezzanine cards.

DETAILED DESCRIPTION

Figure 1:
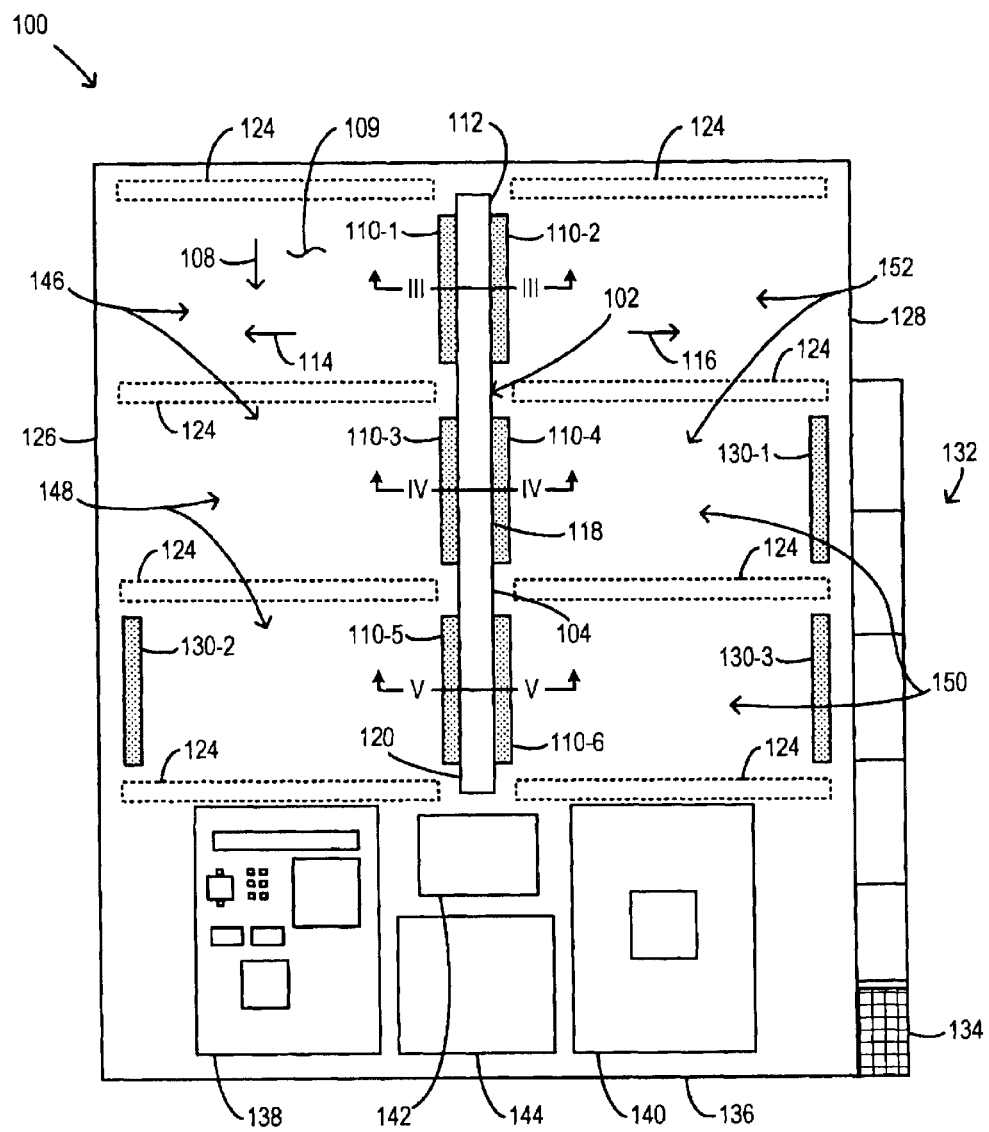
FIG. 1 is a schematic plan view of a circuit board according to some embodiments.
Figure 2:
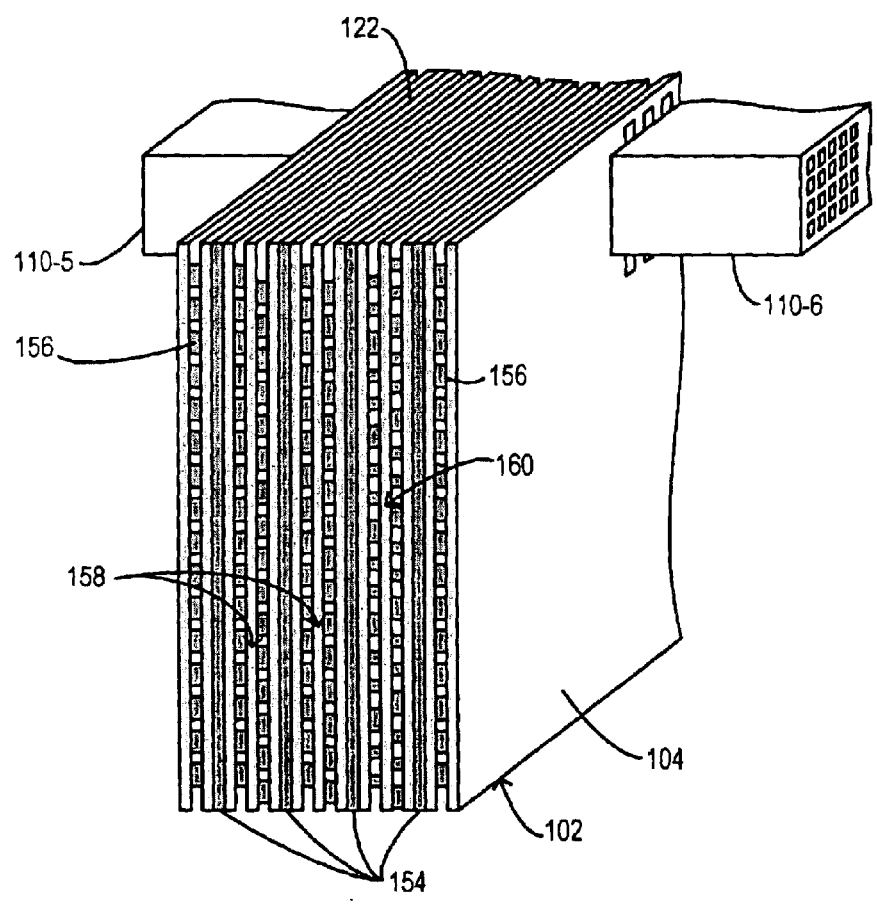
FIG. 2 is a partial perspective view showing in isolation a connector assembly that is mounted on the circuit board of FIG. 1.
Figure 3:
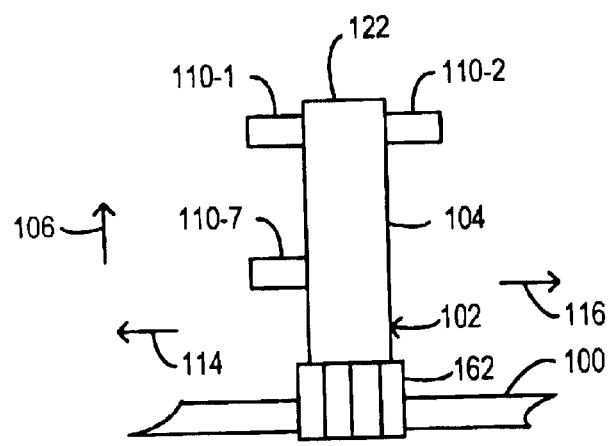
FIG. 3 is a partial, schematic cross-sectional view of the circuit board of FIG. 1, taken at line III—III in FIG. 1.
Figure 4:
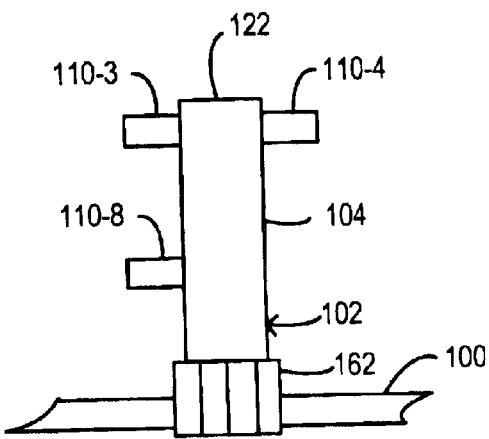
FIG. 4 is a partial, schematic cross-sectional view of the circuit board of FIG. 1, taken at line IV—IV in FIG. 1.
Figure 5:
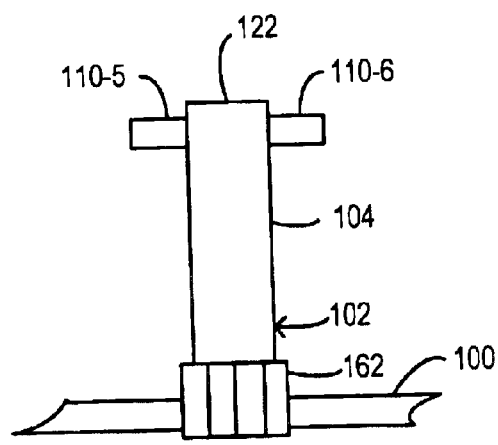
FIG. 5 is a partial, schematic cross-sectional view of the circuit board of FIG. 1, taken at line V—V in FIG. 1.

FIG. 1 is a schematic plan view of a circuit board 100 (sometimes referred to as a baseboard) according to some embodiments. (With respect to all of the drawings except FIG. 15 it is assumed that the circuit boards or circuit board assemblies are used/installed in a horizontal orientation, whereas in practice the boards or board assemblies may also be installed in a vertical orientation.) A connector assembly 102 is mounted on the circuit board 100 and extends outwardly from the circuit board 100. FIG. 2 is a schematic, partial perspective view of the connector assembly 102, shown in isolation. FIGS. 3–5 are partial, schematic cross-sectional views of the circuit board 100 and the connector assembly 102, taken respectively at lines III—III, IV—IV and V—V in FIG. 1.

The connector assembly includes a main body 104 that extends outwardly from the circuit board 100 in a first direction (indicated by arrow 106 in FIG. 3) that is orthogonal to a plane defined by the circuit board 100. The main body 104 of the connector assembly 102 also extends in a second direction (indicated by arrow 108 in FIG. 1) that is parallel to the plane defined by the circuit board 100. The connector assembly 102 is located substantially centrally on a surface 109 of the circuit board 100 and extends parallel to sides (edges) 126, 128 of the circuit board 100.

As best seen from FIG. 2, the main body 104 of the connector assembly 102 may take the form of a sandwich of numerous layers, each extending orthogonally to the circuit board and at least some of which may include numerous signal lines. The number of layers in the main body 104 may be more or fewer than the number indicated in FIG. 2, and the number of signal lines in each layer may be more or fewer than the number indicated in FIG. 2. Some of the layers may be constituted entirely of continuous courses of conductive material used to distribute power signals.

The connector assembly 102 also includes a plurality of connectors 110, including, in some embodiments eight connectors: (1) a first connector 110-1 (FIGS. 1, 3, 6) located at a first end 112 of the main body 104 and extending outwardly from the main body 104 in a third direction (indicated by arrows 114 in FIGS. 1 and 3) that is orthogonal to the first and second directions and is parallel to the plane defined by the circuit board 100; (2) a second connector 110-2 (FIGS. 1, 3, 6) located at the first end 112 of the main body and extending outwardly from the main body 104 in a fourth direction (indicated by arrows 116 in FIGS. 1 and 3) that is opposite to the third direction, orthogonal to the first and second directions and parallel to the plane defined by the circuit board 100; (3) a third connector 110-3 (FIGS. 1, 4, 6) located at a central portion 118 of the main body 104 and extending outwardly from the main body 104 in the third direction; (4) a fourth connector 110-4 (FIGS. 1, 4, 6) located at the central portion 118 of the main body 104 and extending outwardly from the main body 104 in the fourth direction; (5) a fifth connector 110-5 (FIGS. 1, 2, 5, 6) located at a second end 120 of the main body 104 (the second end 120 being opposite to the first end 112 of the main body 104) and extending outwardly from the main body 104 in the third direction; a sixth connector 110-6 (FIGS. 1, 2, 5, 6) located at the second end 120 of the main body 104 and extending outwardly from the main body 104 in the fourth direction; (7) a seventh connector 110-7 (FIG. 3) located at the first end 112 (FIG. 1) of the main body 104 and extending outwardly from the main body 104 in the third direction between the first connector 110-1 and the circuit board 100; and (8) an eighth connector 110-8 (FIG. 4) located at the central portion 118 (FIG. 1) of the main body 104 and extending outwardly from the main body 104 in the third direction between the third connector 110-3 and the circuit board 100.

As will be observed from FIGS. 2–5, the first through sixth connectors 110-1 to 110-6 are near the top 122 of the main body 104, whereas the seventh and eighth connectors 110-7, 110-8 are at an intermediate height on the main body 104 with the seventh connector 110-7 directly below the first connector 110-1 and the eighth connector 110-8 directly below the third connector 110-3.

Figure 6:
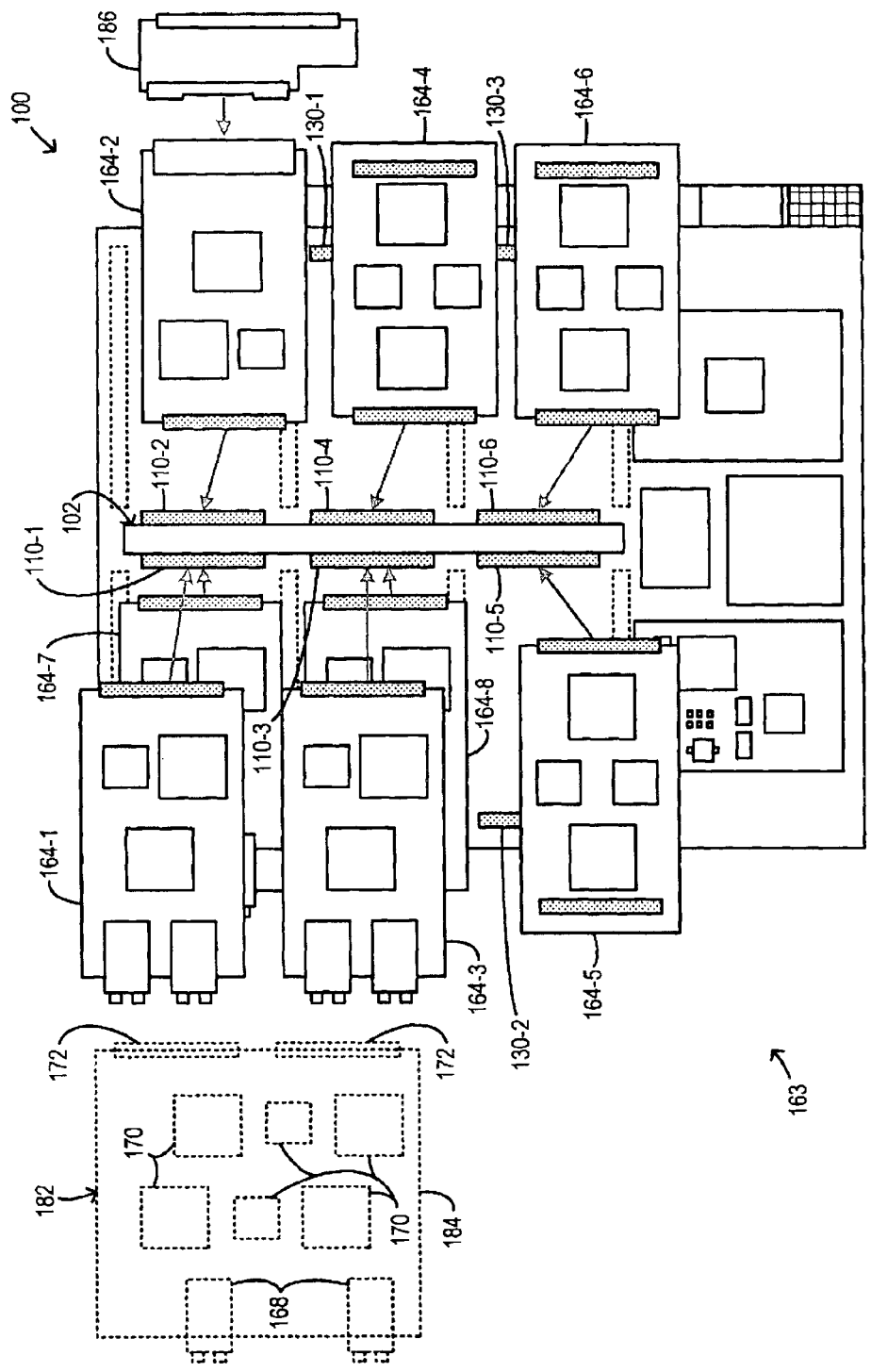
FIG. 6 is a schematic, partially exploded view of a circuit board assembly that includes the circuit board of FIG. 1.

Each of the connectors 110-1 to 110-8 maybe arranged for connection to a respective mezzanine card (the mezzanines cards being shown in FIG. 6 but not in FIGS. 1–5).

A plurality of rails 124 (FIG. 1) are mounted on the circuit board 100 extending between the connector assembly 102 and sides 126, 128 of the circuit board 100. The rails 124 are positioned and configured to function as support members to provide mechanical support for mezzanine cards (FIG. 6, not shown in FIG. 1) connected to the connectors 110-1 to 110-8.

Also mounted on the circuit board 100 are: (1) a connector 130-1 that is separate from the connector assembly 102 and located opposite the fourth connector 110-4 of the connector assembly 102 and extending parallel to the main body 104 of the connector assembly 102 and parallel to the side 128 of the circuit board 100 and adjacent to the side 128 of the circuit board 100 and capable of being connected to a mezzanine card (not shown in FIG. 1) that is connected to the fourth connector 110-4 of the connector assembly 102, (2) a connector 130-2 that is separate from the connector assembly 102 and located opposite the fifth connector 110-5 of the connector assembly 102 and extending parallel to the main body 104 of the connector assembly 102 and parallel to the side 126 of the circuit board 100 and adjacent to the side 126 of the circuit board 100 and capable of being connected to a mezzanine card (not shown in FIG. 1) that is connected to the fifth connector 110-5 of the connector assembly 102, and (3) a connector 130-3 that is separate from the connector assembly 102 and located opposite the sixth connector 110-6 of the connector assembly 102 and extending parallel to the main body 104 of the connector assembly 102 and parallel to the side 128 of the circuit board 100 and in alignment with the connector 130-1 and capable of being connected to a mezzanine card (not shown in FIG. 1) that is connected to the sixth connector 110-6 of the connector assembly 102. Connectors like the connectors 130-1 to 130-3 which are not part of the connector assembly 102 will sometimes be referred to herein and in the appended claims as "separate connectors". The connectors 130-1 to 130-3 may be conventional connectors such as BGA (ball grid array) Berg connectors or "Hi-Bus" connectors.

Arranged along the side 128 of the circuit board 100 (which may be considered the rear side of the circuit board) are connectors 132 which are suitable for connecting the circuit board 100 to a backplane (not shown in FIG. 1) of an electronic device (not shown in FIG. 1) of which the circuit board 100 may be a part. A power connector 134 is also provided at the side 128 of the circuit board 100, adjacent an end 136 of the circuit board 100. The connectors 132 and the power connector 134 may be provided in accordance with conventional practices.

There may also be mounted on the circuit board 100 one or more processing devices, such as a high performance processor chipset 138 (e.g. a Pentium or Xscale chipset, available from Intel Corporation, the assignee hereof) and a high performance network processor 140 (e.g. a Castine or Sausalito network processor, also available from Intel). In addition, there may be provided on the circuit board 100 a communication bridge 142 for allowing communication between the processor chipset 138 and the network processor 140, and a power zone 144 which provides power conversion among various voltages.

The region of the circuit board 100 indicated at 146 may be used for mounting various devices (not separately shown) for "board support" functions, such as an IPMI (Intelligent Platform Management Interface) which manages communications in accordance with the ATCA (Advanced Telecommunications Computing Architecture) standard, hot-swappable and debugging devices, an LED (light emitting diode) display, thin elements such as memory devices, etc.

The region of the circuit board 100 indicated at 148 may be used for mounting various devices (not separately shown) for "processor support" functions, such as processor support bridges, and thin elements such as memory devices (e.g. quad data rate RAM (QDRAM), dual data rate RAM (DDRAM), etc.). The region of the circuit board 100 indicated at 150 may also be used for processor support functions, with the same type of devices (not separately shown) mounted in the region 150 as in the region 148.

The region of the circuit board 100 indicated at 152 may be used for mounting various devices (not separately shown) for "backplane support" functions, such as input/output interfaces, media access controllers, etc.

The circuit board 100 will be understood to include one or more layers of wiring/signal traces (not separately shown) to interconnect as required the devices and components mounted on the circuit board 100, including the connector assembly 102, the separate connectors 130, the backplane connectors 132 and the power connector 134.

Referring again to FIG. 2, which shows some details of the connector assembly 102, planes 154 may be employed to distribute power signals at various voltages (e.g., standard voltages such as +3.3V, +5V, +12V and others depending on needs of the mezzanine cards discussed below, as well as ground). The power planes 154 of the connector assembly 102 may be coupled via through-hole pins (not shown) to power planes (not separately shown) in the circuit board 100.

Signal layers 156 may be used to carry relatively low speed signals, such as signals interfaced to peripheral devices (not shown), I2C buses (which are standard serial buses used for IPMI), UART signals, and GPIO (general purpose input/output) lines. In some embodiments the layers 156 may contain about 150 wires/traces.

Signal layers 158 may be used to carry moderate speed signals, such as PCI buses, UTOPIA (Universal Test and Operations PHY (physical layer) Interface for ATM (Asynchronous Transfer Mode)) buses, SPI-3 buses, CSIX (Common Switch Interface Consortium) buses (which are a standard suitable for connection to a telecommunication switch fabric), TBI/GMII (ten bit interface/gigabit media independent interface), and/or local memory buses. In some embodiments the layers 158 may contain about 150 wires/traces.

Signal layers 160 may be used to carry high speed signals such as differential pairs for, e.g., gigabit Ethernet, SPI-4, Infiniband, etc. In some embodiments, about 2×32 pairs may be provided in the layers 160.

Generally, the main body 104 and signal layers 156–160 maybe formed in similar fashion to a multilayer printed circuit board.

Referring to FIGS. 3–5, a connection 162 between the connector assembly 102 and the circuit board 100 is shown. The connection 162 may be formed with a conventional technology such as, for example, a BGA connector (soldered) or a press-fit connector.

FIG. 6 is a partially exploded view of a circuit board assembly 163 that includes the circuit board 100 of FIG. 1.

FIG. 6 shows how various mezzanine cards 164 may be coupled to the circuit board 100 via the connector assembly 102. In particular, in some embodiments eight mezzanine cards 164-1 to 164-8 may be coupled to the circuit board via, respectively, connectors 110-1 to 110-8 of the connector assembly 102. (Connectors 110-7 and 110-8 are not visible in FIG. 6 but are shown respectively in FIGS. 3 and 4.) In some embodiments, each of the mezzanine cards 164-1 to 164-8 may be single-height mezzanine cards.

Figure 7:
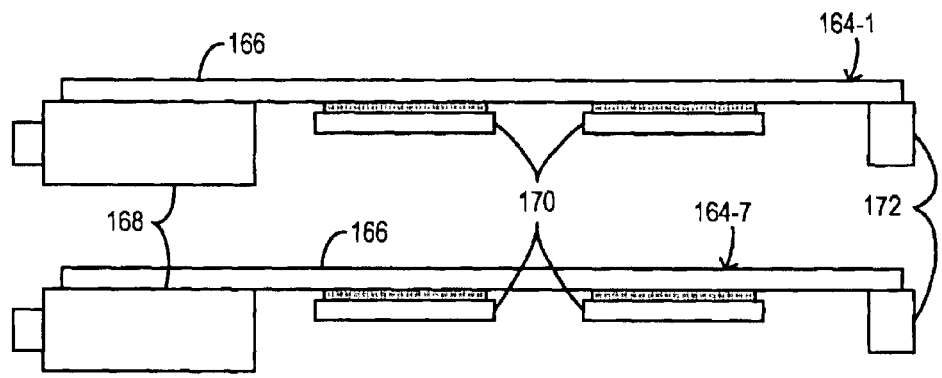
FIG. 7 is a schematic side view showing in isolation two single-height mezzanine cards that may be included in the circuit board assembly of FIG. 6 according to some embodiments.

FIG. 7 is a schematic side view showing, in isolation, mezzanine cards 164-1 and 164-7 in a configuration as those mezzanine cards maybe coupled to connectors 110-1 and 110-7 (not shown in FIG. 7) of the connector assembly 102. It will be observed from FIG. 7 that the mezzanine cards 164-1 and 164-7 are stacked with the mezzanine card 164-1 above the mezzanine card 164-7. (The mezzanine cards 164-3 and 164-8 may be coupled to the connectors 110-3 and 110-8 in the same or a similar configuration as shown in FIG. 7.)

As best seen from FIG. 7, each of mezzanine cards 164-1 and 164-7 may include a card base 166 on which the following components may be mounted: a communication interface (e.g., an interface suitable for coupling to an optical fiber) 168, integrated circuits (ICs) 170 and a connector 172 suitable for connection to one of the connectors 110 of the connector assembly 102. The card base 166 of each mezzanine card includes one or more layers of wiring/signal traces (not separately shown) to interconnect as required the components mounted on the card base 166. (The mezzanine cards 164-3 and 164-8 may be of similar construction, in general terms, to mezzanine cards 164-1, 164-7.) Each of the mezzanine cards 164-1, 164-3, 164-7 and 164-8 maybe of the type commonly referred to as "personality cards". Each of the mezzanine cards 164-1, 164-3, 164-7 and 164-8 may include mutually different ICs 170 so that those mezzanine cards may perform mutually different communication functions, for example.

Figure 8:
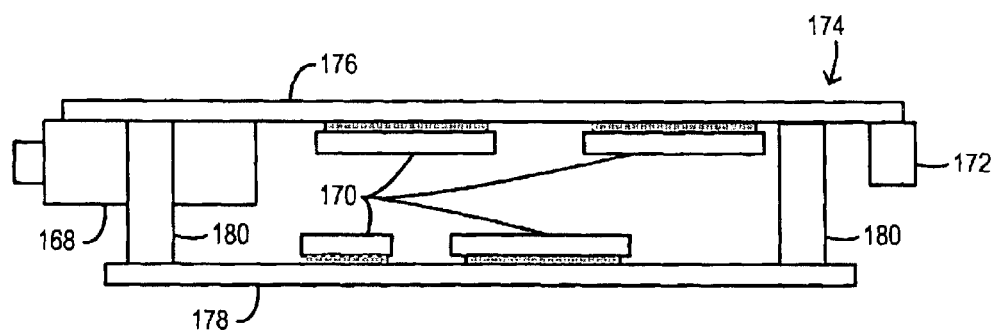
FIG. 8 is a schematic side view showing in isolation a double-height mezzanine card that may be included in a circuit board assembly according to some other embodiments.

In some embodiments, a double-height mezzanine card 174 (schematically shown in FIG. 8) may be coupled to the circuit board 100 in place of the single-height mezzanine cards 164-1 and 164-7 (or in place of the mezzanine cards 164-3 and 164-8). In such a case a connector 172 on the double-height mezzanine card 174 may be coupled to the connector 110-1 of the connector assembly 102 (or to the connector 110-3, as the case may be). The double-height mezzanine card 174, as schematically illustrated in FIG. 8, may include a first card base 176, an second card base 178 mounted in parallel on the first card base 176 via supports 180, a communication interface 168 and a connector 172 mounted on the first card base 176 and ICs 170 mounted on the card bases 176, 178.

In some embodiments, a double-width mezzanine card 182 (shown in phantom in FIG. 6, may be coupled to the circuit board 100 in place of the single-width mezzanine cards 164-1 and 164-3 (or in place of the mezzanine cards 164-7 and 164-8). In such a case, connectors 172 on the double-width mezzanine card 182 may be connected, respectively, to connectors 110-1, 110-3 of the connector assembly 102 (or to the connectors 110-7, 110-8, as the case may be). The double-width mezzanine card 182 may include communication interfaces 168 and ICs 170 mounted on a double-width card base 184.

In some embodiments, the mezzanine card 164-2 may be a personality card suitable for connection between connector 110-2 of the connector assembly 102 and a rear input/output module 186 (FIG. 6). In some embodiments, the rear input/output module 186 may extend farther than shown in FIG. 6 along the side 128 of the circuit board toward the end 136 of the circuit board 100 and may fit outside of the backplane (not shown in FIG. 6) of the electronic device of which the circuit board assembly 163 is a part.

In some embodiments, the mezzanine card 164-4 may be a mapping card coupled between the separate connector 130-1 and the connector 110-4 of the connector assembly 102 to provide a connection between the backplane and the personality mezzanine cards coupled to the connector assembly 102. The mapping mezzanine card 164-4 may also derive voltages not provided on the baseboard 100 to other mezzanine cards 164 via the connector assembly 102.

Figure 9:
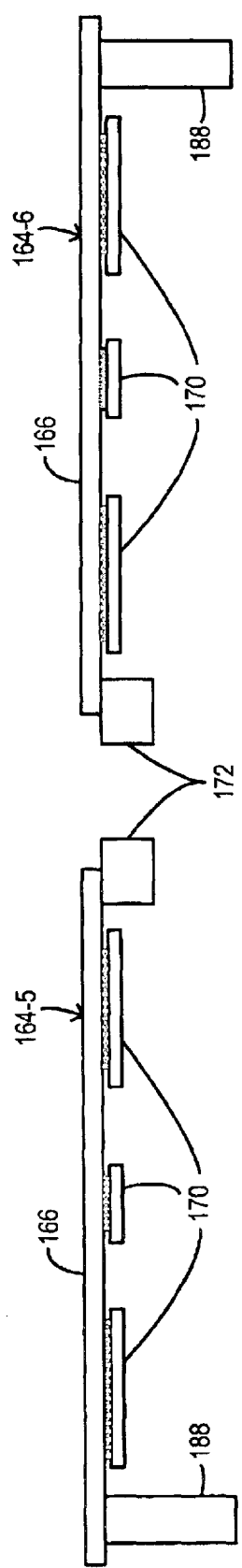
FIG. 9 is a schematic side view showing in isolation two mezzanine cards that may be included in the circuit board assembly of FIG. 6 according to some embodiments.

In some embodiments, the mezzanine cards 164-5 and 164-6 may be configuration cards that provide an interface between components on the baseboard 100 and the personality cards 164-1, 164-2, 164-3, 164-7 and 164-8. FIG. 9 schematically shows the mezzanine cards 164-5 and 164-6 in isolation and in a configuration in which the mezzanine cards 164-5 and 164-6 are coupled to the connectors 110-5, 110-6, respectively, of the connector assembly 102. Each of the mezzanine cards 164-5 and 164-6 may include a connector 172 to be coupled to the connector 110-5 or 110-6, as the case may be, ICs 170 and another connector 188, all mounted on a card base 166, with the connector 188 being suitable for coupling to the separate connector 130-2 or 130-3 (as the case may be) of the baseboard 100.

Some signals may be provided to/from the mezzanine cards 164 via buses. Other signals may be routed among the mezzanine cards 164 over point-to-point connections via the connector assembly 102. A multibus bridge to accommodate point-to-point connections may be located on one of the configuration cards 164-5 or 164-6.

Each connector 110 may, in some embodiments, accommodate up to 300 signal pins (including power pins) for each mezzanine card 164.

By providing the connector assembly 102 illustrated in FIGS. 1–6, problems may be solved in regard to limited board space, and in regard to connecting the various devices on the baseboard and the mezzanine cards. Moreover, with configuration mezzanine cards acting as interfaces between baseboard electronics and other mezzanine cards, design changes in the baseboard (e.g., due to adoption of new baseboard ICs) may be more readily accommodated without changes to some of the mezzanine cards. Life cycles for both mezzanine cards and for baseboard architecture may be extended.

In some embodiments, not all of the connectors 110 have a mezzanine card coupled thereto.

Figure 10:
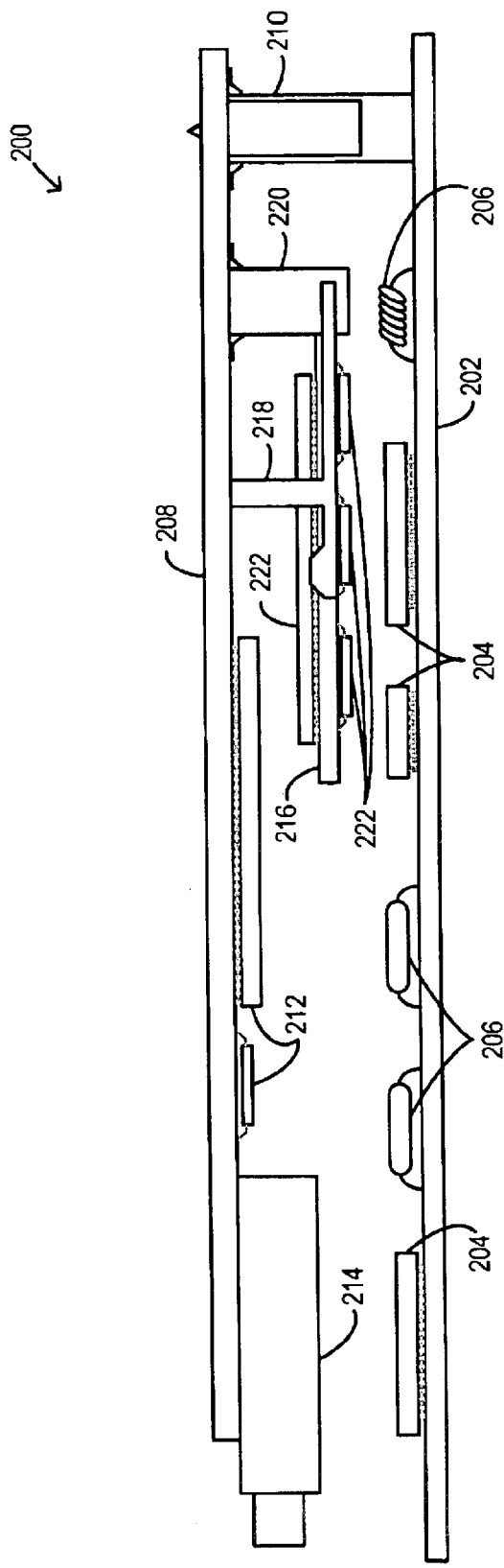
FIG. 10 is a schematic side view of a circuit board assembly according to some other embodiments.

FIG. 10 is a schematic side view of a circuit board assembly 200 according to some other embodiments.

The circuit board assembly 200 includes a base circuit board (also referred to as a "baseboard") 202, which has ICs 204 and discrete components 206 mounted thereon. The baseboard 202 also includes one or more layers of wiring/signal traces (not separately shown) to interconnect as required components and/or connectors mounted on the baseboard 202. The circuit board assembly 200 also includes a mezzanine card 208, which may be mounted in parallel fashion on the baseboard 202 via a conventional mounting arrangement such as a MICTOR connector 210. ICs 212 and a communications interface 214 (e.g., an optical fiber interface), may be mounted on the mezzanine card 208. The mezzanine card 208 may be, for example, a gigabit personality card or an ATM personality card. The mezzanine card 208 also includes one or more layers of wiring/signal traces (not separately shown) to interconnect as required components and/or connectors mounted on the mezzanine card 208.

The circuit board assembly 200 further includes an interface card 216 mounted in parallel fashion on the mezzanine card 208 via a mounting structure 218. The interface card 216 serves as a signal interface between at least one component on the baseboard 202 and at least one component on the mezzanine card 208. Signal connections to the interface card 216 are made via a connector structure 220 which connects the interface card 216 to signal paths (discussed below) on the mezzanine card 208. One or more ICs 222 may be mounted on the interface card 216.

Figure 11:
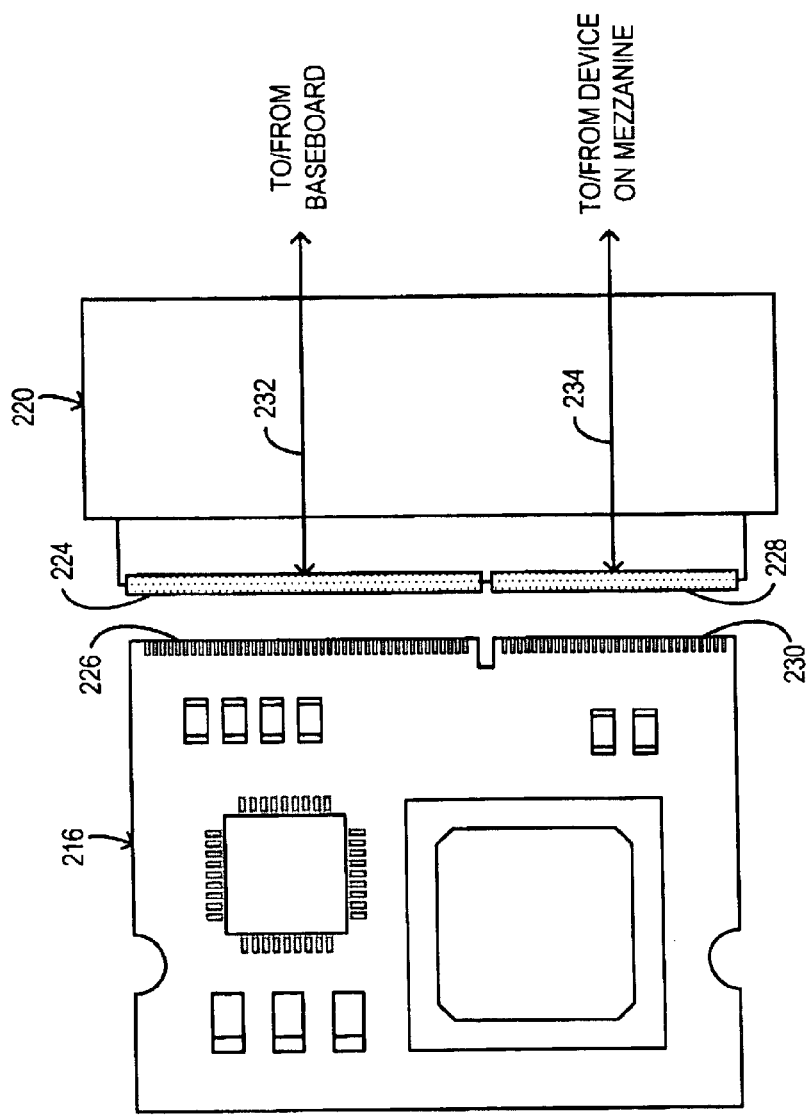
FIG. 11 is a schematic plan view of an interface card that may be part of the circuit board assembly of FIG. 10, shown in juxtaposition with a connector structure for the interface card.

FIG. 11 is a schematic plan view of interface card 216, as provided according to some embodiments, shown in juxtaposition with the connector structure 220. The connector structure 220 includes a first signal connector 224 configured to be coupled to a signal connector 226 on the interface card 216 and a second signal connector 228 configured to be coupled to a signal connector 230 on the interface card 216.

A first signal path 232 is connected to the first signal connector 224 and passes along the mezzanine card 208 (FIG. 10; first signal path 232 not separately shown in FIG. 10) without being coupled to any device on the mezzanine card 208. Rather, the first signal path 232 is coupled via the MICTOR connector 210 to the baseboard 202 and to one or more devices on the baseboard 202. A second signal path 234 is connected to the second signal connector 228 and is coupled to at least one device on the mezzanine card 208.

Figure 12:
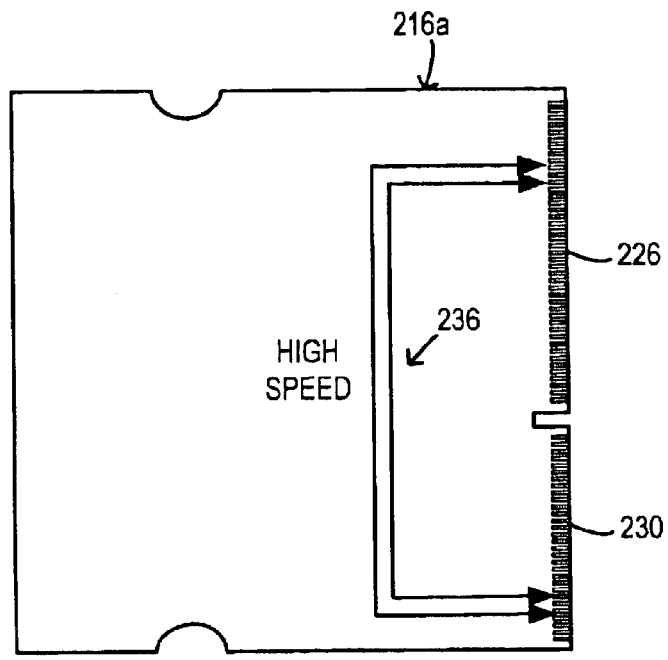
FIG. 12 is a schematic plan view of another interface card that may be part of the circuit board assembly of FIG. 10.

FIG. 12 is a schematic plan view of an interface card 216a provided in accordance with some other embodiments. There may be no ICs mounted on the interface card 216a. Rather the interface card 216a may merely provide a high speed signal path 236 between connectors 226, 230. The interface card 216a may be suitable for use where the baseboard 202 and the mezzanine card 208 both operate with the same type of high speed signals.

Figure 13:
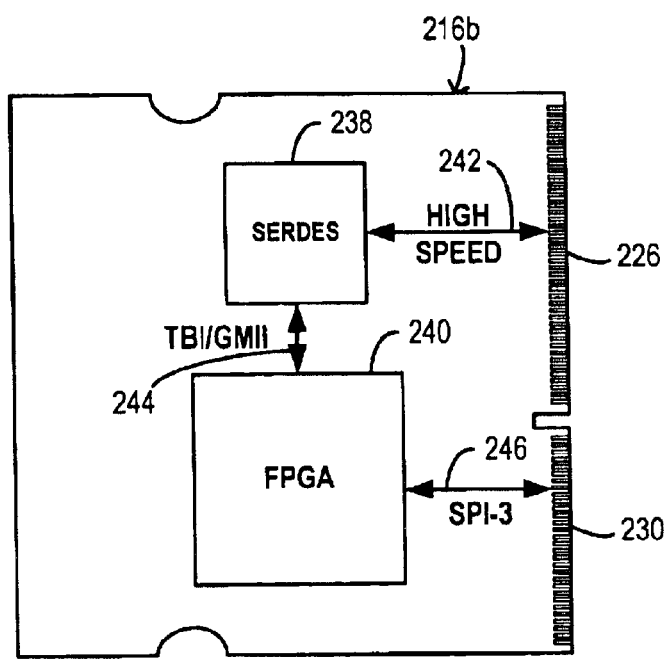
FIG. 13 is a schematic plan view of still another interface card that may be part of the circuit board assembly of FIG. 10.

FIG. 13 is a schematic plan view of an interface card 216b provided in accordance with still other embodiments. A serializer/deserializer 238 and a field programmable gate array (FPGA) 240 may be mounted on the interface card 216b. A high speed signal path 242 may be provided between the connector 226 and the serializer/deserializer 238. A TBI/GMII signal path 244 may be provided between the serializer/deserializer 238 and the FPGA 240. An SPI-3 signal path 246 may be provided between the FPGA 240 and the connector 230. The interface card 216b may be suitable for use where the baseboard 202 operates with high speed (serial) signals and the mezzanine card 208 operates with SPI-3 (parallel) signals.

Figure 14:
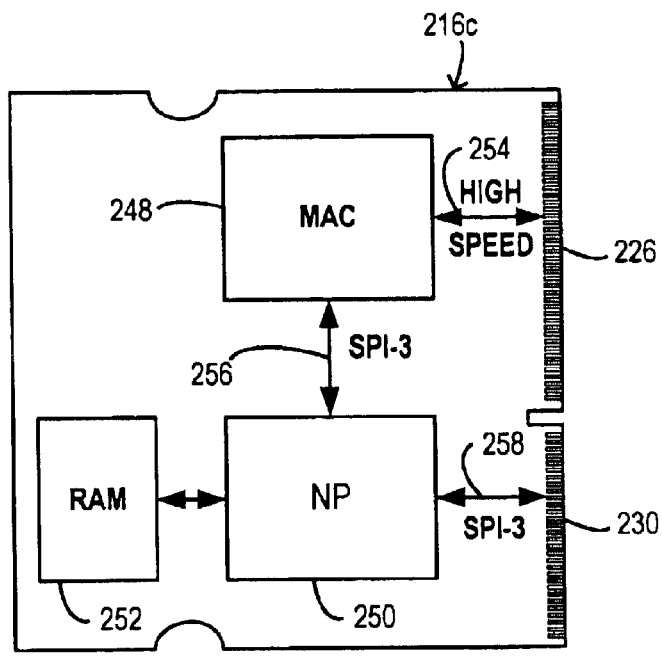
FIG. 14 is a schematic plan view of yet another interface card that may be part of the circuit board assembly of FIG. 10.

FIG. 14 is a schematic plan view of an interface card 216c provided in accordance with yet other embodiments. A media access controller (MAC) 248 and a network processor (NP) 250 may be mounted on the interface card 216c. A random access memory (RAM) 252 may also be mounted on the interface card 216c in association with the NP 250. A high speed signal path 254 may be provided between the connector 226 and the MAC 248. A first SPI-3 signal path 256 may be provided between the MAC 248 and the NP 250. A second SPI-3 signal path 258 may be provided between the NP 250 and the connector 230. The interface card 216c may be suitable for use where the baseboard 202 operates with high speed signals (e.g., a differential pair signal such as gigabit Ethernet, 10BaseCX, Infiniband, or PCI-Express) and the mezzanine card 208 operates with SPI-3 signals. The interface card 216c may be capable of providing preprocessing (e.g., cryptography and/or signal segmentation) in addition to translation between high speed and SPI-3 signals.

With an interface card as described above providing an interface between a baseboard and a mezzanine card, upgrades or changes in design in a baseboard may take place without requiring redesign of a mezzanine card to be used with the baseboard. Rather, it may only be necessary to redesign the interface card to accommodate changes in the baseboard. Redesign of the interface card may take less time and be less expensive than redesign of the mezzanine card. Moreover, the life cycle of mezzanine cards may be extended by use of such interface cards, and legacy mezzanine cards may be compatible with new/upgraded baseboards. Such interface cards may also facilitate field upgrades of baseboards.

Figure 15:
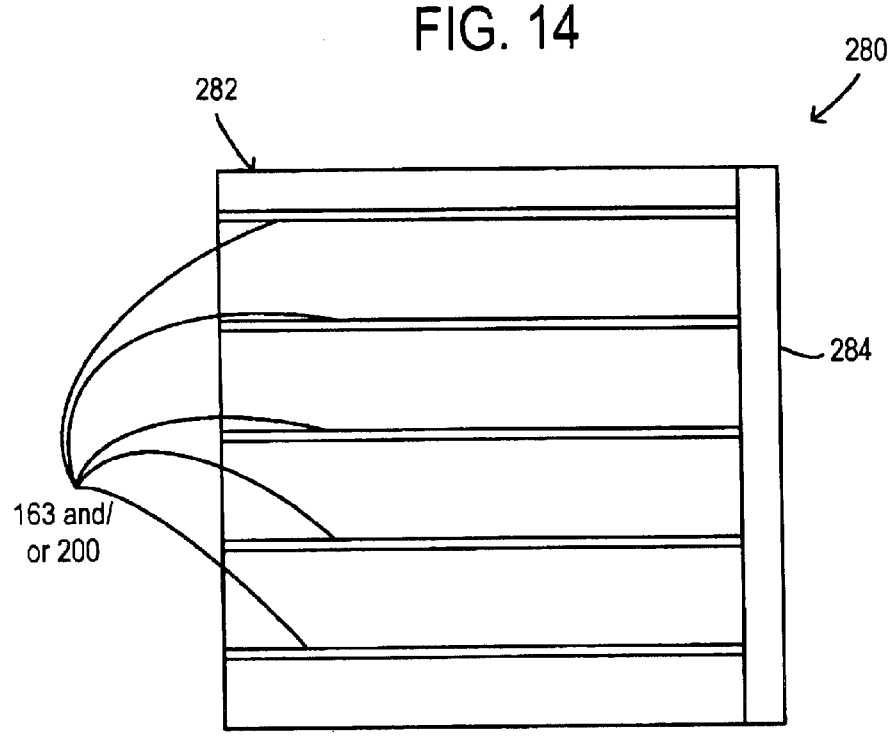
FIG. 15 is a schematic plan view of an electronic apparatus that may incorporate one or more circuit board assemblies like those shown in FIG. 6 or FIG. 10.

FIG. 15 is a schematic plan view of an electronic apparatus 280 that may incorporate one or more circuit board assemblies like the circuit board assembly 163 of FIG. 6 or the circuit board assembly 200 of FIG. 10.

The electronic apparatus 280 (which may be a computer, a server or a data communication device such as a switch, media gateway or edge router) includes a chassis 282 on which a backplane 284 is mounted. One or more circuit board assemblies 163 and/or 200 are coupled to the backplane 284.

Thus, in some embodiments, an apparatus includes a circuit board and a connector assembly which extends outwardly from the circuit board and is capable of simultaneously being connected to a plurality of mezzanine cards.

In some other embodiments, an apparatus includes a mezzanine card, an interface card, a structure mounting the interface card on the mezzanine card, first and second signal connectors connecting the interface card to the mezzanine card, a first signal path connected to the first signal connector and passing along the mezzanine card without being coupled to any device on the mezzanine card, and a second signal path connected to the second signal connector and coupled to at least one device on the mezzanine card.

As used herein and in the appended claims:

an item is said to be "mounted in parallel fashion" when mounted so as to be parallel to the item it is mounted on;

"signal connector" refers to a structure that connects one circuit element to another so that a signal may pass between the two elements;

"circuit element" refers to an electrical or electronic device, conductor or circuit board or card;

"separate connector" refers to a connector that is not part of a connector assembly;

"mezzanine card" refers to an add-on printed circuit board which is mounted parallel to a host or base circuit board;

"connector assembly" refers to a structure that extends upwardly from a circuit board and supports two or more connectors.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:

a circuit board;
a connector assembly which extends outwardly from the circuit board and is capable of simultaneously being connected to a plurality of mezzanine cards, the connector assembly including:
  a main body that extends outwardly from the circuit board in a first direction that is orthogonal to a plane defined by the circuit board and extends in a second direction that is parallel to the plane defined by the circuit board; and
  a plurality of connectors mounted on the main body, each of the connectors capable of being connected to a respective mezzanine card, the plurality of connectors including a first connector that extends outwardly from the main body in a third direction that is orthogonal to the first and second directions, a second connector that extends outwardly from the main body in a fourth direction that is opposite to the third direction, the first and second connectors being located at a first end of the main body, the plurality of connectors further including a third connector located at a central portion of the main body and extending outwardly from the main body in the third direction, a fourth connector located at the central portion of the main body and extending outwardly from the main body in the fourth direction, a fifth connector located at a second end of the main body, the second end being opposite to the first end of the main body, the fifth connector extending outwardly from the main body in the third direction, a sixth connector located at the second end of the main body and extending outwardly from the main body in the fourth direction, a seventh connector located at the first end of the main body between the first connector and the circuit board, and extending outwardly from the main body in the third direction, and an eighth connector located at the central portion of the main body between the third connector and the circuit board, and extending outwardly from the main body in the third direction;
a first separate connector mounted on the circuit board and extending parallel to the main body of the connector assembly and located to be capable of being connected to a mezzanine card connected to the fourth connector of the connector assembly;
a second separate connector mounted on the circuit board and extending parallel to the main body of the connector assembly and located to be capable of being connected to a mezzanine card connected to the fifth connector of the connector assembly; and
a third separate connector mounted on the circuit board and extending parallel to the main body of the connector assembly in alignment with the first separate connector and located to be capable of being connected to a mezzanine card connected to the sixth connector of the connector assembly.

2. The apparatus of claim 1, further comprising:

eight mezzanine cards, each connected to a respective one of the first through eighth connectors.

* * * * *